US 8,210,578 B2

(12) United States Patent
Tang

(10) Patent No.: US 8,210,578 B2
(45) Date of Patent: Jul. 3, 2012

(54) ELECTRONIC DEVICE ENCLOSURE

(75) Inventor: Zi-Ming Tang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 579 days.

(21) Appl. No.: 12/391,159

(22) Filed: Feb. 23, 2009

(65) Prior Publication Data

US 2010/0090568 A1    Apr. 15, 2010

(30) Foreign Application Priority Data

Oct. 10, 2008  (CN) .......................... 2008 1 0304874

(51) Int. Cl.
*E05C 9/10* (2006.01)
*E05C 19/06* (2006.01)
(52) U.S. Cl. ....... 292/38; 292/84; 292/171; 292/341.15; 292/DIG. 11; 292/DIG. 38
(58) Field of Classification Search ................ 292/3, 80, 292/137, 8, 10, 19, 24, 28, 30, 32, 38, 41, 292/84, 86, 116, 119, 125, 127, 133, 135, 292/156, 168, 141, 171, 179, 180, 341.15, 292/DIG. 11, DIG. 38; 361/679.58; 312/223.2, 312/265.5; 220/3.2, 3.7, 3.8, 3.92, 4.02, 220/326; 174/559–563, 520; 70/58, 63–76
See application file for complete search history.

(56) References Cited

U.S. PATENT DOCUMENTS

| 151,529 | A | * | 6/1874 | Baker ................................ 292/1 |
| 876,300 | A | * | 1/1908 | Couret .......................... 292/135 |
| 4,395,892 | A | * | 8/1983 | Remington ..................... 70/312 |
| 5,072,464 | A | * | 12/1991 | Draheim et al. ................. 5/93.1 |
| 5,703,329 | A | * | 12/1997 | Delone .......................... 174/67 |
| 5,875,948 | A | * | 3/1999 | Sadler ........................... 224/404 |
| 6,517,129 | B1 | * | 2/2003 | Chien et al. ............... 292/251.5 |
| 6,574,097 | B2 | * | 6/2003 | Hood et al. .............. 361/679.58 |
| 6,935,661 | B1 | * | 8/2005 | Farnsworth et al. .......... 292/162 |
| 7,261,328 | B2 | * | 8/2007 | Minix .............................. 292/28 |
| 7,635,811 | B2 | * | 12/2009 | Chen et al. ...................... 174/50 |
| 7,679,904 | B2 | * | 3/2010 | Tang ........................ 361/679.58 |
| 7,708,322 | B2 | * | 5/2010 | Timothy et al. ............... 292/137 |
| 7,947,902 | B2 | * | 5/2011 | Tang ............................... 174/50 |
| 2002/0093794 | A1 | * | 7/2002 | Quardt et al. ................. 361/726 |
| 2002/0185944 | A1 | * | 12/2002 | Chen ......................... 312/223.2 |
| 2007/0035920 | A1 | * | 2/2007 | Peng et al. .................... 361/685 |

FOREIGN PATENT DOCUMENTS

GB    2205348 A  * 12/1988

* cited by examiner

*Primary Examiner* — Carlos Lugo
*Assistant Examiner* — Alyson M Merlino
(74) *Attorney, Agent, or Firm* — Altis Law Group, Inc.

(57) ABSTRACT

An electronic device enclosure includes a housing defining a latching groove, a cover defining a latching hook to engage in the latching groove, and an opening assembly mounted in the housing. The opening assembly includes a sliding member slidably positioned in the latching groove, and an operation member positioned in the housing and connected to sliding member. The sliding member defines an abutting surface on the sliding member. The operating member is capable of pulling the sliding member to slide along the latching groove, so that the abutting surface of the sliding member pushes against the latching hook and disengages the latching hook from the latching groove.

11 Claims, 6 Drawing Sheets

ELECTRONIC DEVICE ENCLOSURE

BACKGROUND

1. Technical Field

The present disclosure relates to an enclosure for use in an electronic device.

2. Description of Related Art

Electronic devices, such as desktop computers, notebook computers, digital video disc players, are very popular and widely used. An electronic device generally includes an enclosure for securing electronic components therein.

A typical electronic device enclosure includes a housing and a cover fixed on the housing to cover an opening of the housing. The cover may be fixed on the housing by screws or bolts. However, it is very inconvenient to assemble or disassemble, because the screws or bolts must be screwed or unscrewed one by one. In addition, the electronic device enclosure may be deformed after multiple assemblies or disassemblies, thereby creating an unsatisfactory appearance.

Another typical electronic device enclosure includes a housing, a cover, a plurality of latching hooks formed on the cover, and a plurality of latching steps defined on the housing corresponding to the latching hooks. The cover is pressed onto the housing by an external force until the latching hooks are latched with the latching steps. However, it is difficult to disassemble the cover from the housing because a strong external force is needed to detach the latching hooks from the latching steps. Moreover, the latching hooks can break during disassembly, because of the strong external force, thereby damaging the electronic device enclosure.

What is needed, therefore, is a new electronic device enclosure that overcomes the above mentioned disadvantages.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views, and all the views are schematic.

DETAILED DESCRIPTION OF THE EMBODIMENTS

Figure 1:
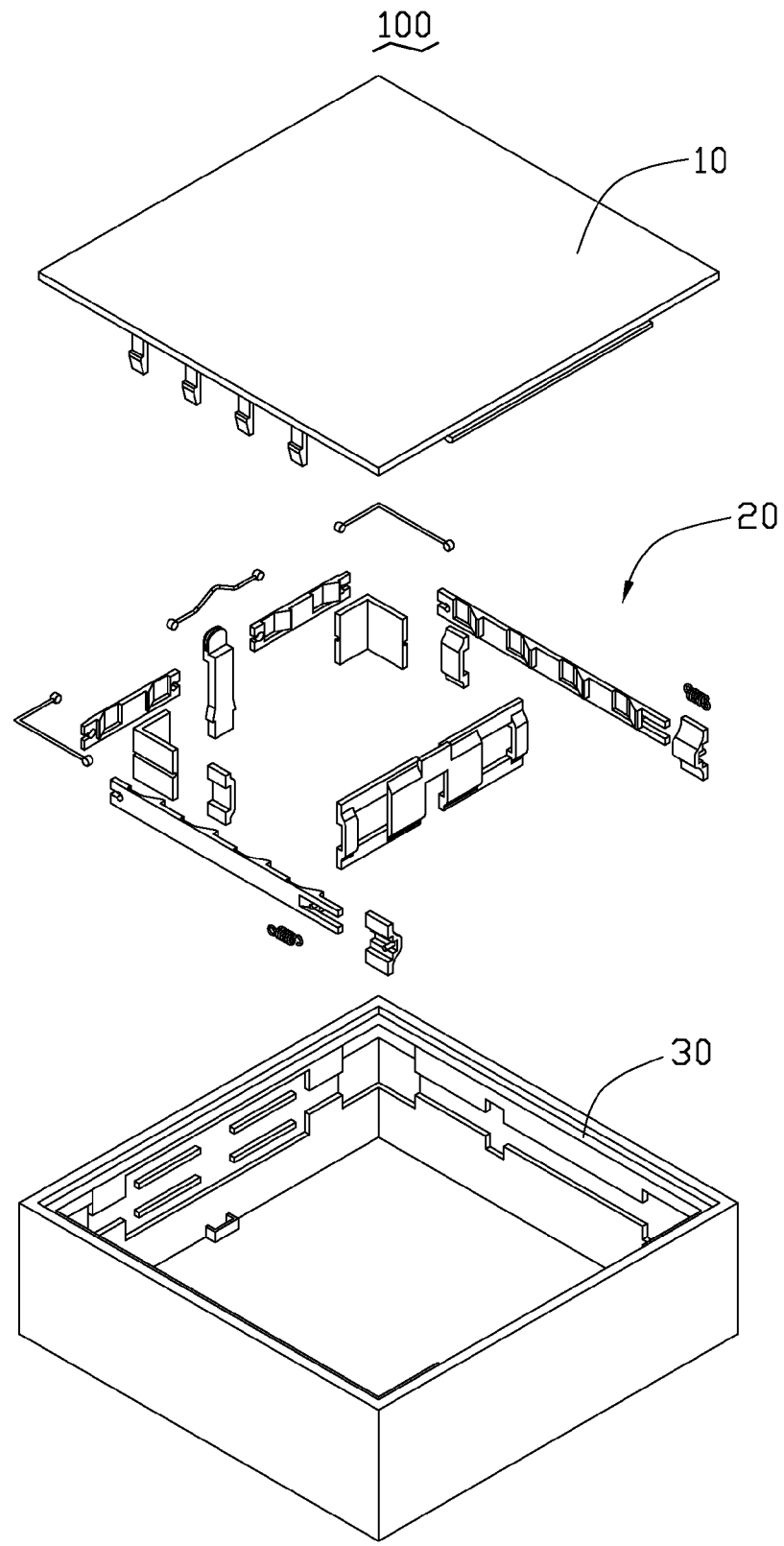
FIG. 1 is an exploded, isometric view of an embodiment of the electronic device enclosure, the electronic device enclosure including a cover, an opening assembly, and a housing.

Referring to FIG. 1, an electronic device enclosure 100 includes a cover 10, an opening assembly 20, and a housing 30. The cover 10 is removably fixed on the housing 30. The opening assembly 20 is mounted in the housing 30.

Figure 2:
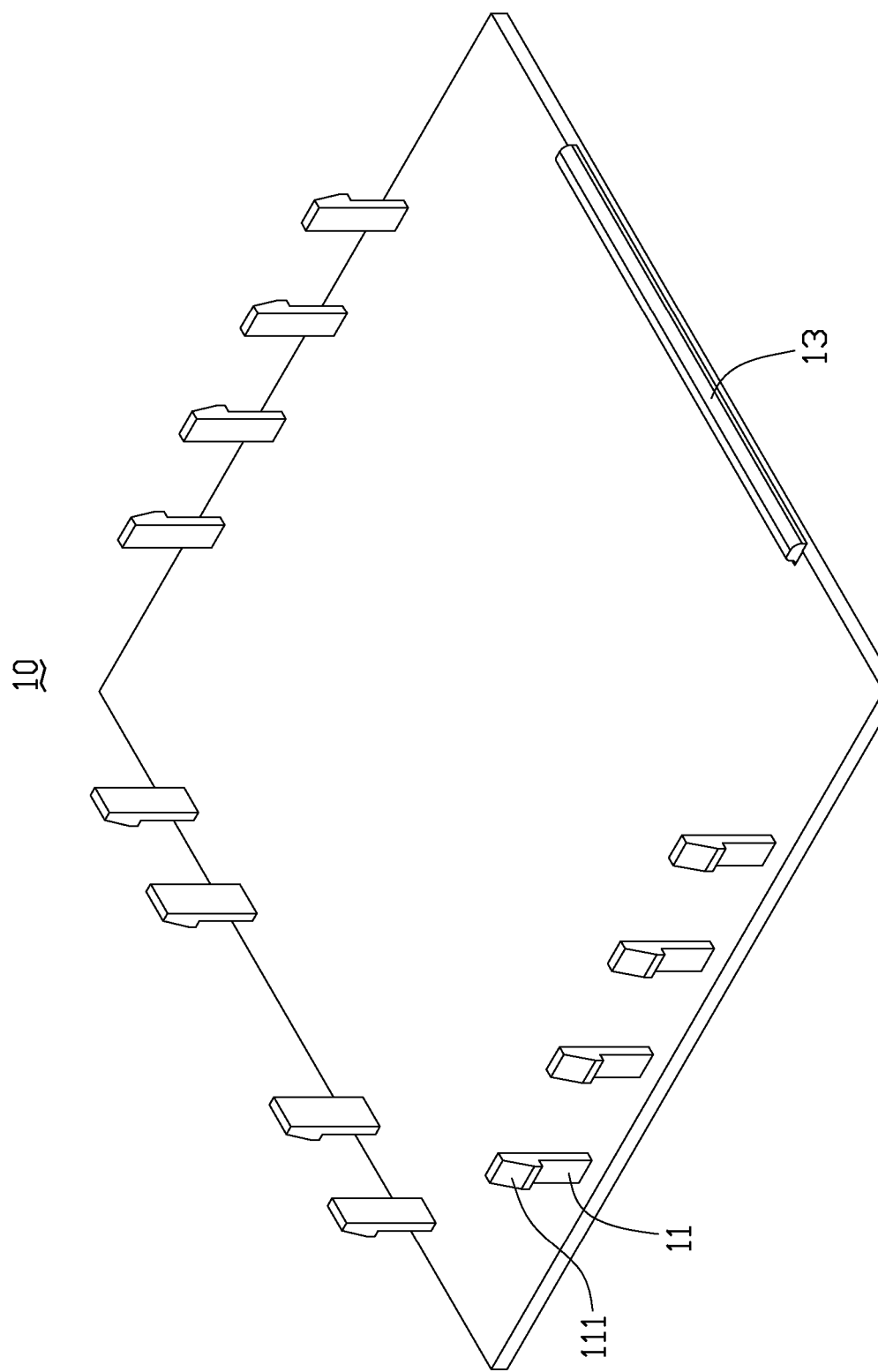
FIG. 2 is an isometric view of the cover of the electronic device enclosure in FIG. 1.

Referring to FIG. 2, the cover 10 may be a substantially rectangular plate having four edge portions, and includes a plurality of latching hooks 11 formed on three of the four edge portions of the cover 10, and an engaging protrusion 13 formed on a remainder edge portion of the cover 10. The latching hook 11 includes a latching protrusion 111 formed on an end of the latching hook 11.

Figure 3:
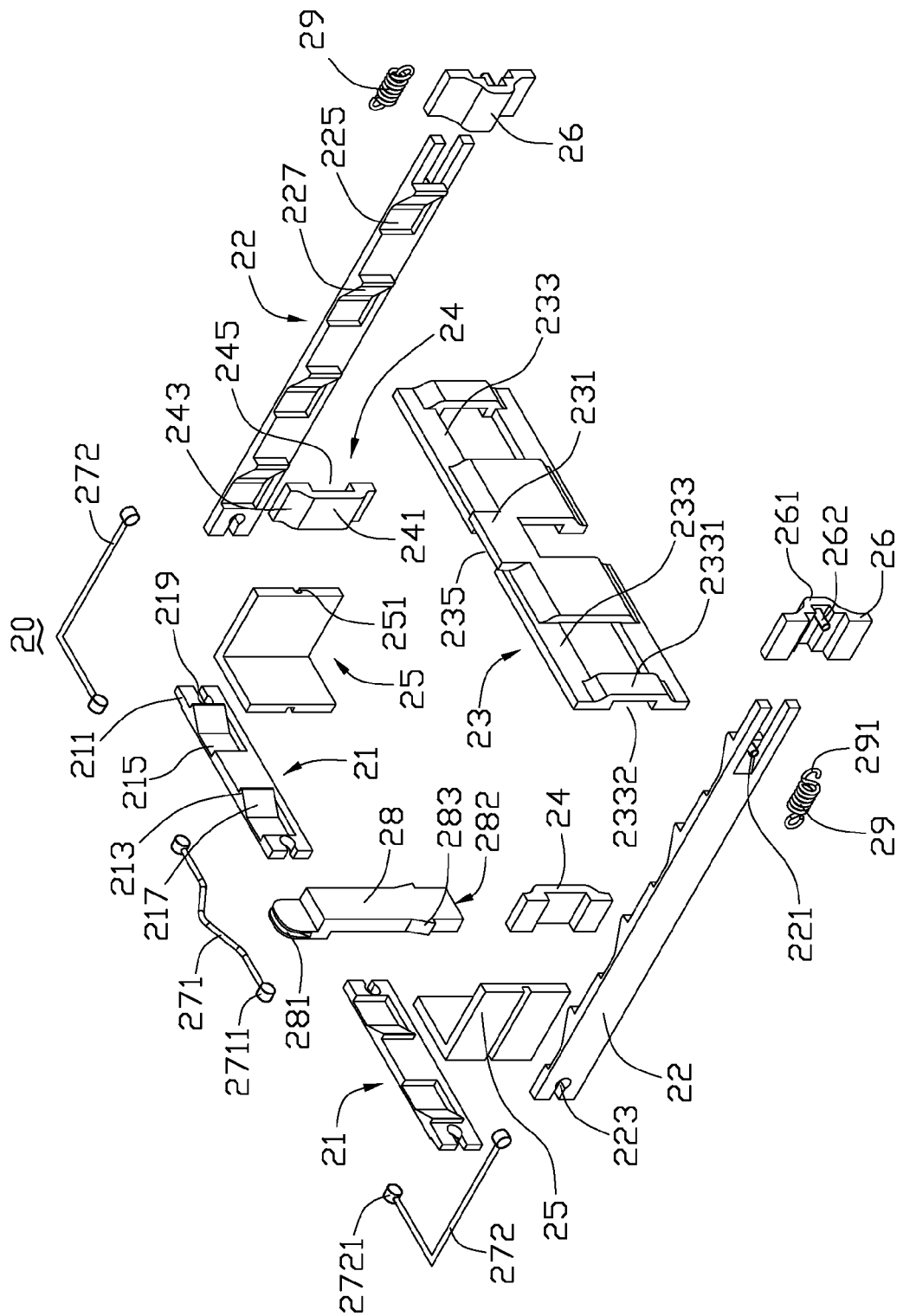
FIG. 3 is an exploded, isometric view of the opening assembly of the electronic device enclosure in FIG. 1.

Referring to FIG. 3, the opening assembly 20 includes two first sliding members 21, two second sliding members 22, a limiting member 23, two retaining members 24, two shielding members 25, two connecting members 26, a first traction wire 271, two second traction wires 272, an operating member 28, and two elastic members 29.

Each first sliding member 21 includes a base plate 211, a plurality of abutting protrusions 213 formed on the base plate 211, and a plurality of latching recesses 215 defined in the base plate 211. The abutting protrusions 213 and the latching recesses 215 are positioned on the base plate 211 in an alternating manner. Each abutting protrusion 213 has an abutting surface 217 adjacent to an adjacent latching recess 215, in which the abutting surface 217 may be a slanted surface, such that the abutting surface 217 and the adjacent latching recess 215 cooperatively define an obtuse angle. The base plate 211 also defines two engaging holes 219 in two ends of the base plate 211.

Each second sliding member 22 is similar in principle to the first sliding member 21, and also includes a plurality of latching recesses 225 and a plurality of abutting surfaces 227. However, the second sliding member 22 is longer than the first sliding member 21, and the second sliding member 22 includes an engaging column 221 formed on a first end, and an engaging hole 223 defined in a second end.

The limiting member 23 includes a connecting portion 231, and two base portions 233 formed on two ends of the connecting portion 231. The two base portions 233 and the connecting portion 231 cooperatively define a recess 235 for receiving the operating member 28. Each base portion 233 includes a retaining portion 2331 formed on an end, and defines a retaining recess 2332 in the retaining portion 2331 for retaining the first sliding member 21. The vertical width of the retaining recess 2332 is slightly larger than the height of the first sliding member 21, so that the first sliding member 21 is movable in the retaining recess 2332.

Each retaining member 24 includes a base portion 241, and two curved portions 243 formed on opposite ends of the base portion 241. The base portion 241 defines a retaining recess 245 between the two curved portions 243 to retain the second sliding member 22. The vertical width of the retaining recess 245 is slightly larger than the height of the second sliding member 22, so that the second sliding member 22 is movable in the retaining recess 245.

Each shielding member 25 is substantially L-shaped, and defines a receiving groove 251 in a middle portion of the shielding member 25 to receive the second traction wire 272.

Each connecting member 26 has a similar shape with the retaining member 24, but the connecting member 26 includes a base portion 261 and a connecting column 262 formed on the base portion 261.

The first traction wire 271 includes two positioning poles 2711 positioned on opposite ends of the first traction wire 271. Each second traction wire 272 includes two positioning poles 2721 positioned on opposite ends of the second traction wire 272.

The first traction wire 271 and each second traction wires 272 may be metallic wires, such as cylindrical steel wires. The radial width of each second traction wire 272 is slightly smaller than the width of the receiving groove 251 such that each second traction wire 272 is movable in the receiving groove 251.

The operating member 28 includes a guiding groove 281 defined in a first end, an operating surface 282 formed on a second end, and two limiting protrusions 283 formed on opposite sides of the operating portion 28 adjacent to the second end.

In the illustrate embodiment, each elastic member 29 is a helical tension spring, and includes two hooks 291 formed on two ends of each elastic member 29.

Figure 4:
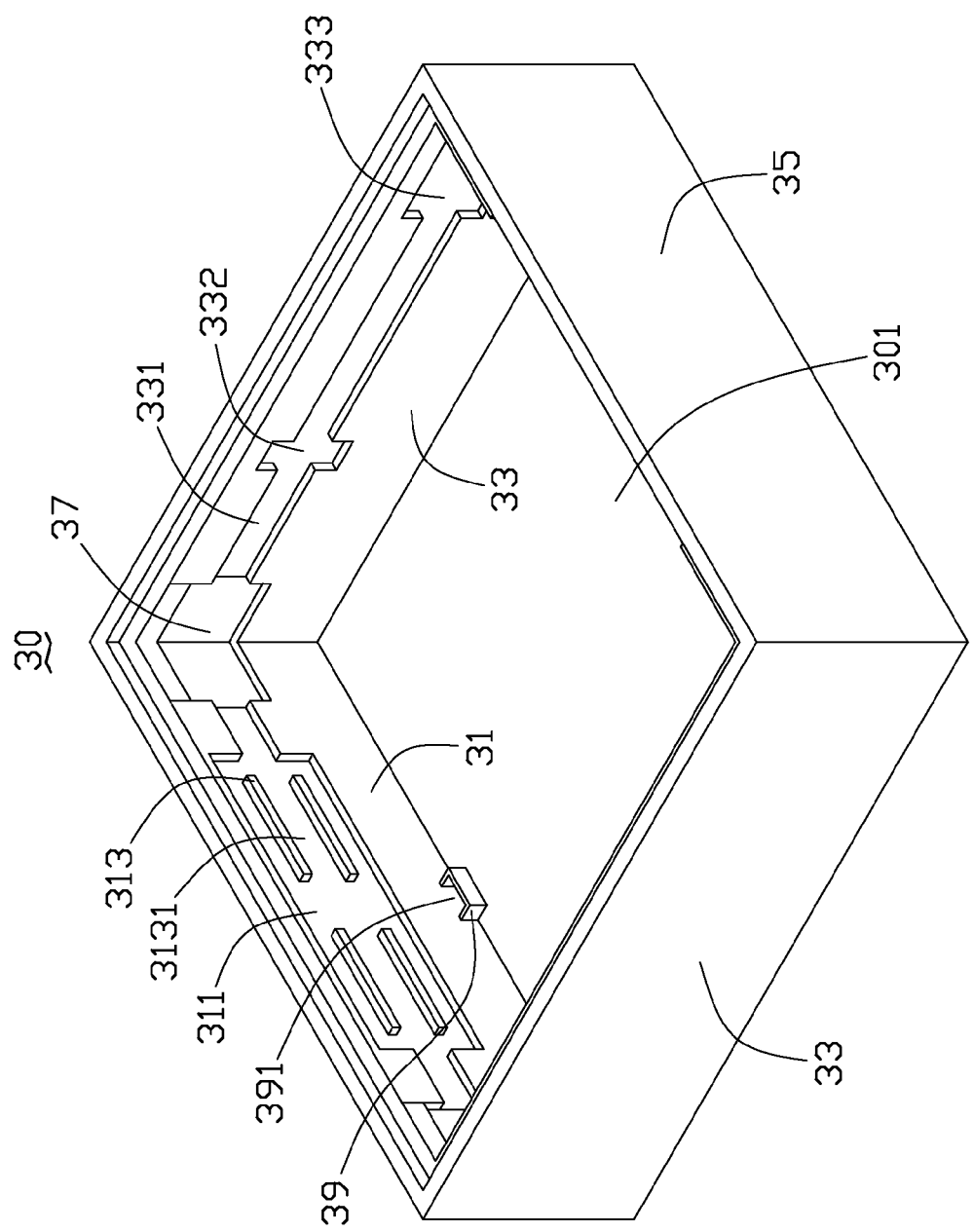
FIG. 4 is an isometric view of the housing of the electronic device enclosure in FIG. 1.

Referring also to FIG. 4, the housing 30 includes a rectangular base 301, and a first sidewall 31, a pair of second sidewalls 33, and a third sidewall 35 extending substantially perpendicularly from a periphery of the base 301. The first sidewall 31 is opposite the third sidewall 35, and the two second sidewalls 33 are opposite each other.

The base 301 includes a mounting portion 39 formed on an end adjacent to the first sidewall 31. The mounting portion 39 and the first sidewall 31 cooperatively define a mounting hole 391 for mounting the operating member 28. The mounting hole 391 runs through the base 301. The first sidewall 31 defines a mounting groove 311 in an inner surface. Four guiding portions 313 are positioned on bottom surface of the mounting groove 311. Two of the guiding portions 313 are opposite to each other, and cooperatively define a first latching groove 3131 between two guiding portions 313. Each second sidewall 33 defines a second latching groove 331 in an inner surface, and two fixing grooves 332, 333 communicating with the second latching groove 331. The third sidewall 35 defines an engaging hole 351 (shown in FIG. 6) in an inner surface. The housing 30 further includes two mounting recesses 37 defined in two corners where the first sidewall 31 and the second sidewalls 33 intersect.

Figure 5:
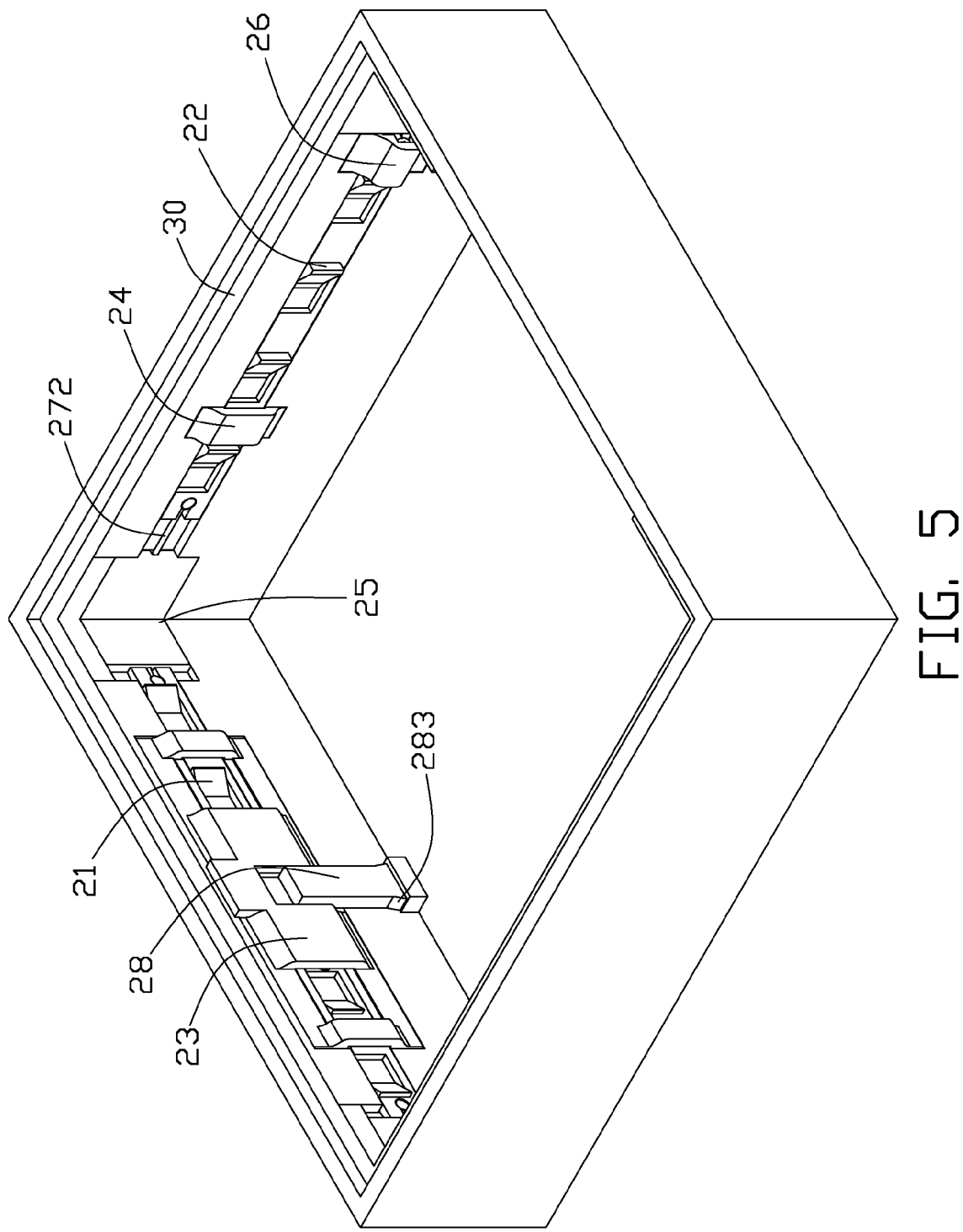
FIG. 5 is a partial, assembled view of the electronic device enclosure in FIG. 1.

Referring also to FIG. 5, in assembly of the electronic device enclosure 100, the first sliding members 21 are connected by the first traction wire 271, by inserting positioning poles 2711 into the corresponding engaging holes 219 of the first sliding members 21. The first sliding members 21 are then positioned in the first latching grooves 3131. The operating member 28 is inserted into the mounting hole 391 of the housing 30. A middle portion of the first traction wire 271 is latched in the guiding groove 281. The limiting protrusions 283 abut on a top surface of the mounting portion 39, thus preventing the operating member 28 from disengaging from the housing 30. The operating surface 282 is exposed to an outer surface of the base 11 to facilitate operation of the operating member 28. The limiting member 23 is fixed in the mounting groove 311 to support the operating member 28 and the first sliding members 21.

Each second sliding member 22 is then connected to each first sliding member 21 by the second traction wire 272, by inserting the positioning poles 2721 into the engaging hole 219 of the first sliding member 21 and the engaging hole 223 of the second sliding member 22. The second sliding members 22 are then positioned in the second latching grooves 331. The retaining members 24 are fixed in the fixing grooves 332 to support the second sliding members 22. The shielding members 25 are fixed in the mounting recesses 37 to shield the second traction wires 272. Two hooks 291 of the elastic member 29 are hung on the engaging column 221 and the connecting column 262. The connecting members 26 are fixed in the fixing grooves 333 to shield the elastic members 29. After assembly, the first sliding members 21 are slidable in the first latching grooves 3131, and the second sliding members 22 are slidable in the second latching grooves 331.

Figure 6:
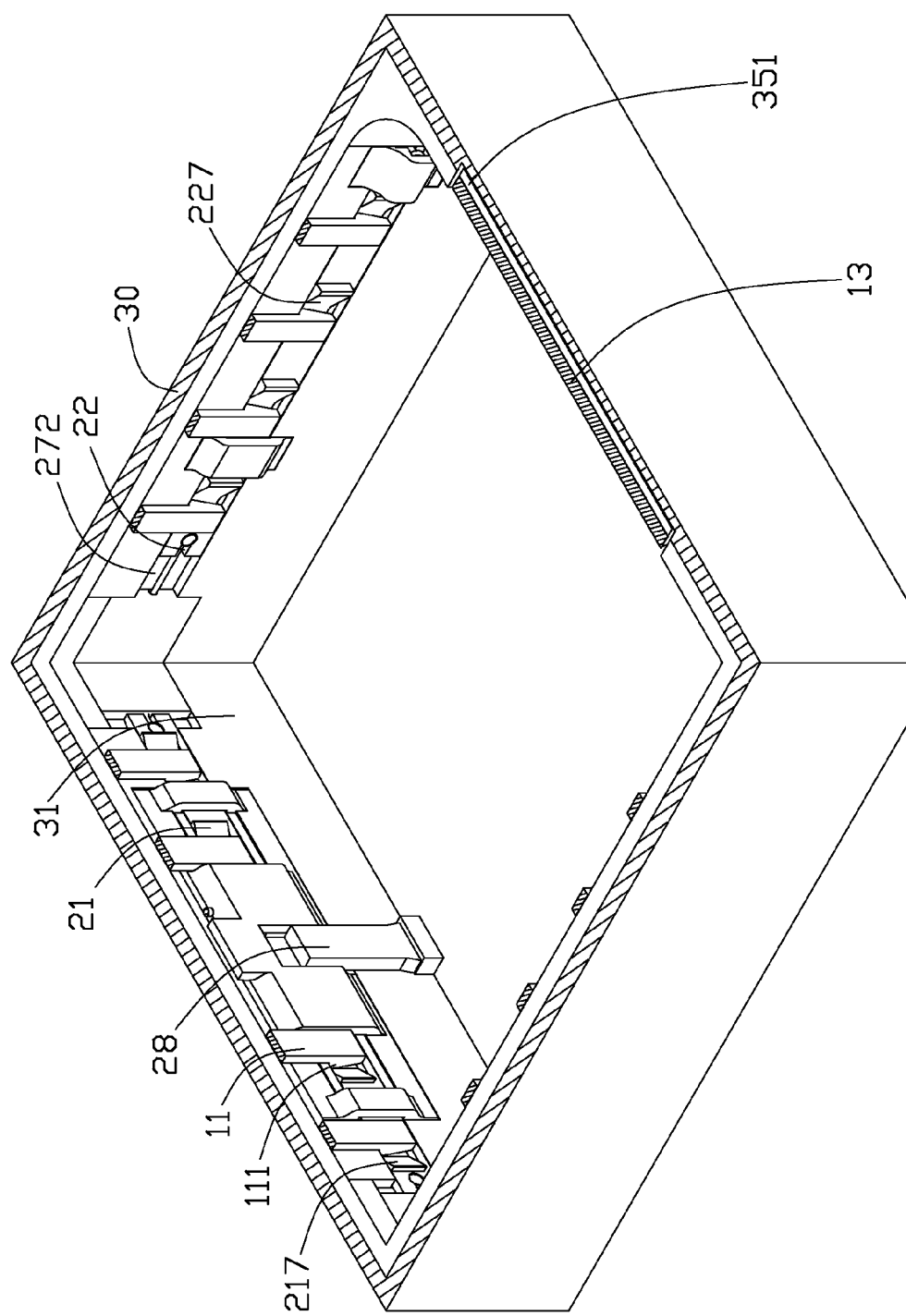
FIG. 6 is a cross-sectional, isometric view of the electronic device enclosure in FIG. 1, in an assembled state.

Referring also to FIG. 6, when assembling the cover 10 on the housing 30, the engaging protrusion 13 of the cover 10 is engaged in the engaging hole 351 of the housing 30. The cover 30 is then pressed until the latching protrusions 111 of the latching hooks 11 are engaged in the first latching grooves 3131 and the second latching grooves 331. Thus, the cover 10 is assembled on the housing 30.

When disassembling the cover 10 from the housing 30, the operating surface 282 is pressed by an external force, so that the operating member 28, together with the first traction wire 271, move upwards by pulling the first sliding members 21 to move towards the operating member 28, thereby pushing the abutting surfaces 217 of the first sliding members 21 against the latching hooks 11 and disengaging the latching protrusions 111 from the first latching grooves 3131. Simultaneously, the second sliding members 22 move towards the first sidewall 31, due to a pulling force created by the second traction wires 272, thereby pushing the abutting surfaces 227 of the second sliding members 22 against the latching hooks 11 and disengaging the latching protrusions 111 from the second latching grooves 331. Finally, the cover 10 is lifted away from the housing 30, the engaging protrusion 13 disengages from the engaging hole 351. As a result, the cover 10 is disassembled from the housing 30.

When the latching hooks 11 are disassembled from the first and second latching grooves 3131, 331, the first and second sliding members 21, 22 move to their initial positions due to an elastic force created by the elastic members 29, thus facilitating reassembling the cover 10.

In the above electronic device enclosure 100, the cover 10 can be stably assembled on the housing 30 by pressing the cover 10, and the cover 10 can be easily disassembled from the housing 30 by pressing the operating surface 282 of the operating member 28. Thus, it is convenient to assemble or disassemble the electronic device enclosure 100. Moreover, deformation or damage to the electronic device enclosure 100 due to assembling or disassembling can be reduced and avoided.

In alternative embodiments, the housing 30 may include a first sliding rail formed on the first sidewall 31, and two second sliding rails formed on the second sidewalls 33. Each of the first and second sliding members 21, 22 may define a sliding groove to engage with the first or second sliding rail, respectively. Thus, the first and second sliding members 21, 22 can slide along the first and second sliding rails, respectively. In this configuration, the first and second latching grooves 3131, 331 may be omitted, and the latching recesses 215, 225 of the first and second sliding members 21, 22 may be substituted by latching grooves to engage with the latching hooks. The cover 10 may include a plurality of elastic pieces fixed on the cover 10 adjacent to the latching hooks 11, so that when the latching hooks 11 are disengaged from the first and second latching grooves 3131, 331, the cover 10 can be partially pushed out of the housing 30 via the elastic force created by the elastic pieces.

It is believed that the present embodiments and their advantages will be understood from the foregoing description, and it will be apparent that various changes may be made thereto without departing from the spirit and scope of the disclosure or sacrificing all of its material advantages.

What is claimed is:
1. An electronic device enclosure, comprising:
a housing defining at least one latching groove;
a cover comprising at least one latching hook to engage in the at least one latching groove;
at least one sliding member slidably positioned in the at least one latching groove, the at least one sliding member defining at least one abutting surface;
a first traction wire; and
an operation member defining a guiding groove in a first end thereof;

wherein the housing comprises a rectangular base and four sidewalls extending substantially perpendicularly from a periphery of the base, the at least one latching groove comprises a first latching groove defined in a first sidewall of the four sidewalls, and two second latching grooves defined in a pair of second sidewalls of the four sidewalls;

wherein the at least one sliding member comprises two first sliding members slidably positioned in the first latching groove, and two second sliding members slidably positioned in the second latching grooves respectively; the two first sliding members are connected by the first traction wire, each second sliding member is connected to a corresponding one of the first sliding members by a second traction wire, and a middle portion of the first traction wire is latched in the guiding groove, such that movement of the operation member slides the first and second sliding members within the first and second latching grooves, respectively; and wherein when the first and second sliding members slide along the first and second latching grooves, the at least one abutting surface pushes against the at least one latching hook to disengage the at least one latching hook from the first and second latching grooves.

2. The electronic device enclosure of claim 1, wherein each sliding member comprises a base plate, at least one abutting protrusion is formed on the base plate, and at least one latching recess is defined in the base plate; the at least one abutting surface is formed on the at least one abutting protrusion adjacent to the latching recess.

3. The electronic device enclosure of claim 2, wherein the at least one abutting surface is a slanted surface such that the at least one abutting surface and the at least one latching recess cooperatively define an obtuse angle.

4. The electronic device enclosure of claim 1, wherein the base comprises a mounting portion formed on an end adjacent to the first sidewall; the mounting portion and the first sidewall cooperatively define a mounting hole; the operation member is mounted in the mounting hole.

5. The electronic device enclosure of claim 4, wherein the mounting hole runs through the base; the operating member comprises an operating surface formed on a second end, and two limiting protrusions formed on opposite sides thereof; the limiting protrusions abut on a top surface of the mounting portion; the operating surface is exposed to an outer surface of the base.

6. The electronic device enclosure of claim 1, wherein a mounting groove is defined in the first sidewall; the electronic device enclosure further comprises at least one limiting member fixed in the mounting groove to support the first sliding members.

7. The electronic device enclosure of claim 6, wherein the at least one limiting member defines two retaining recesses in two ends, the two first sliding members are retained in the two retaining recesses respectively; a vertical width of each retaining recess is slightly larger than a height of each first sliding member.

8. The electronic device enclosure of claim 1, wherein two fixing grooves communicating with the second latching grooves are defined in each second sidewall; the electronic device enclosure further comprises two retaining members fixed in the two fixing grooves to support the two second sliding members.

9. The electronic device enclosure of claim 8, wherein each retaining member defines a retaining recess; each second sliding member is retained in each corresponding retaining recess; a vertical width of each retaining recess is slightly larger than a height of each second sliding member.

10. The electronic device enclosure of claim 1, wherein the electronic device enclosure further comprises two elastic members and two connecting members fixed on the pair of second sidewalls of the housing adjacent to the second latching grooves; each second sliding member is connected to each connecting member by each elastic member.

11. The electronic device enclosure of claim 1, wherein the housing defines a mounting recess in a corner; the electronic device enclosure further comprises a shielding member fixed in the mounting recess; the shielding member defines a receiving groove to receive the second traction wire.

* * * * *